United States Patent
Sugahara et al.

(10) Patent No.: US 7,365,377 B2
(45) Date of Patent: Apr. 29, 2008

(54) SEMICONDUCTOR INTEGRATED CIRCUIT DEVICE USING FOUR-TERMINAL TRANSISTORS

(75) Inventors: Takeshi Sugahara, Fujisawa (JP); Yasuhito Itaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 82 days.

(21) Appl. No.: 11/166,243

(22) Filed: Jun. 27, 2005

(65) Prior Publication Data
US 2006/0197110 A1     Sep. 7, 2006

(30) Foreign Application Priority Data
Mar. 3, 2005   (JP)   ............... 2005-058736

(51) Int. Cl.
*H01L 27/10*    (2006.01)
*H01L 29/73*    (2006.01)

(52) U.S. Cl. .............. 257/206; 257/202; 257/203; 257/204; 257/210; 257/371; 257/E27.067; 257/E27.108; 257/E27.11

(58) Field of Classification Search ............... None
See application file for complete search history.

(56) References Cited

U.S. PATENT DOCUMENTS 6,194,776 B1 * 2/2001 Amano et al. ............ 257/550
6,525,394 B1   2/2003 Kuhn et al.
7,049,699 B1 * 5/2006 Masleid et al. ........... 257/758
2004/0189651 A1 * 9/2004 Zatz et al. ................. 345/531

FOREIGN PATENT DOCUMENTS

JP     11-251447     9/1999

* cited by examiner

*Primary Examiner*—Minhloan Tran
*Assistant Examiner*—Leslie Pilar Cruz
(74) *Attorney, Agent, or Firm*—Oblon, Spivak, McClelland, Maier & Neustadt, P.C.

(57) ABSTRACT

In a semiconductor substrate of a first conductivity type, a first well region of the first conductivity type, second well regions of a second conductivity type, and a third well region of the second conductivity type are formed. The second well regions are formed in the semiconductor substrate excluding the region where the first well region has been formed. The third well region is formed under the first and second well regions in the semiconductor substrate in such a manner that a part of the third well region under the first well region is removed, thereby connecting the second well regions to one another electrically.

11 Claims, 16 Drawing Sheets

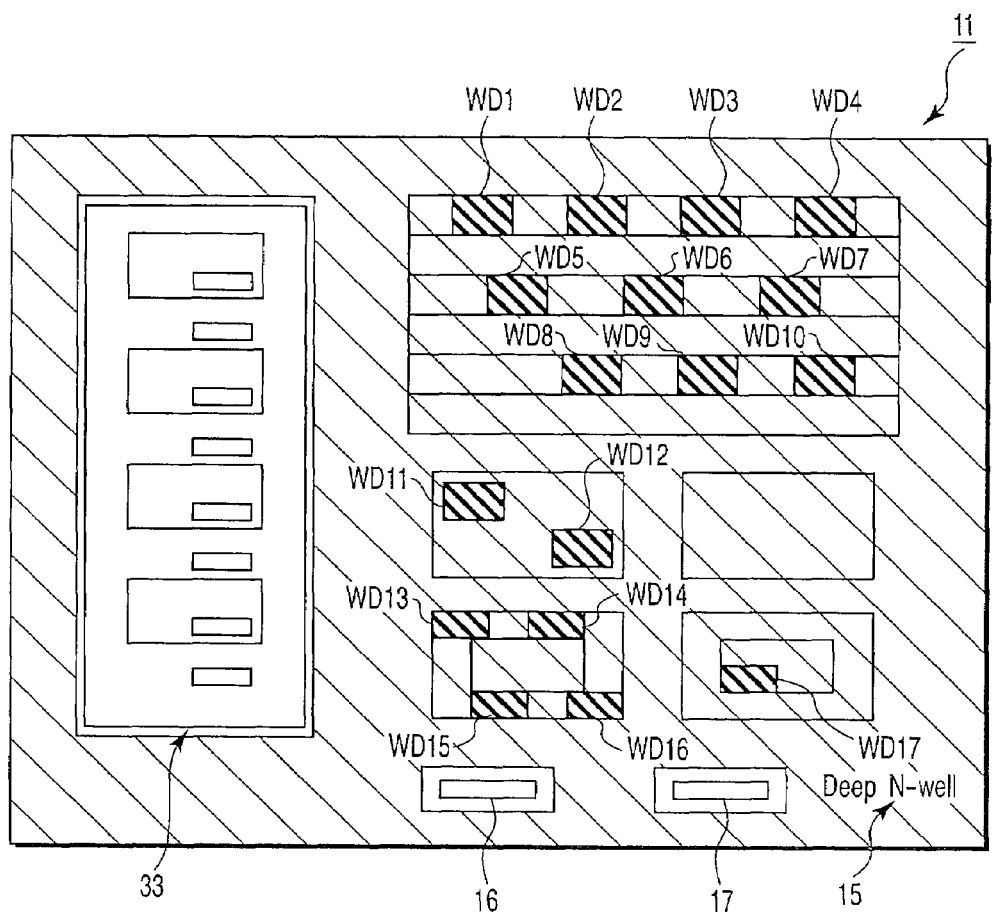
F I G. 16

SEMICONDUCTOR INTEGRATED CIRCUIT DEVICE USING FOUR-TERMINAL TRANSISTORS

CROSS-REFERENCE TO RELATED APPLICATIONS

This application is based upon and claims the benefit of priority from prior Japanese Patent Application No. 2005-058736, filed Mar. 3, 2005, the entire contents of which are incorporated herein by reference.

BACKGROUND OF THE INVENTION

1. Field of the Invention

This invention relates to a semiconductor integrated circuit device, and more particularly to the technique for applying a back gate bias to a four-terminal transistor in an LSI.

2. Description of the Related Art

With the recent miniaturization of LSI devices, the power supply voltage has been getting lower and therefore currents flowing in the well regions and the semiconductor substrate have been becoming smaller. As a result, the resistances of the well regions are almost negligible, which makes smaller the problems of the occurrence of latch-up and fluctuations in the voltages at the well regions and the semiconductor substrate. Normally, each circuit is composed of three-terminal transistors. In a three-terminal transistor, since the source and the back gate have the same potential (if the transistor is a p-channel MOS transistor, they are at a power supply voltage VDD, and if the transistor is an n-channel MOS transistor, they are at the ground potential GND), the back gate (well region) is connected to the power supply via metal wiring or the like.

However, the circuit section which has to adjust the threshold voltage of the MOS transistor requires a four-terminal transistor capable of setting the back gate to a potential different from that of the source. Such a circuit section is formed in a well region electrically separated from the semiconductor substrate and other well regions. Then, a well bias potential is applied to the circuit section. For example, in the case of n-channel MOS transistors, a p-well region in which an n-channel MOS transistor is to be formed is enclosed by an n-well region. Under these p-well region and n-well region, a deep n-well region is formed, thereby separating the p-well region electrically from the semiconductor substrate and other well regions. Then, a well bias potential is applied via metal wiring or the like to the p-well region, thereby applying a back gate bias (refer to, for example, Jpn. Pat. Appln. KOKAI Publication No. H11-251447).

As described above, since the semiconductor integrated circuit device using four-terminal transistors requires new wiring for applying a potential to the back gate to be added, which causes the problem of making the die size larger than when using three-terminal transistors.

BRIEF SUMMARY OF THE INVENTION

According to an aspect of the present invention, there is provided a semiconductor integrated circuit device comprising a semiconductor substrate of a first conductivity type, a first well region of the first conductivity type which is formed in the semiconductor substrate, a plurality of second well regions of a second conductivity type which are formed in the semiconductor substrate excluding the region where the first well region has been formed, and a third well region of the second conductivity type which is formed under the first and second well regions in the semiconductor substrate in such a manner that a part of the third well region under the first well region is removed and which connects the second well regions to one another electrically.

According to another aspect of the present invention, there is provided a semiconductor integrated circuit device comprising a semiconductor substrate of a first conductivity type, a first well region of the first conductivity type which is formed in a first region of the semiconductor substrate, a plurality of second well regions of a second conductivity type which are formed in the first region of the semiconductor substrate excluding the region where the first well region has been formed, a third well region of the second conductivity type which is formed under the first and second well regions in the first region of the semiconductor substrate in such a manner that a part of the third well region under the first well region is removed and which connects the second well regions to one another electrically, a fourth well region of the first conductivity type which is formed in a second region of the semiconductor substrate, a fifth well region of the second conductivity type which is formed in the second region of the semiconductor substrate so as to enclose the fourth well region, and a sixth well region which is formed under the fourth and fifth well regions in the semiconductor substrate so as to separate the fourth well region from the semiconductor substrate electrically.

BRIEF DESCRIPTION OF THE SEVERAL VIEWS OF THE DRAWING

FIG. 16 is an imaginary diagram of the whole of a chip in applying a back gate bias, which helps explain the well structure of a semiconductor integrated circuit device according to the fourth embodiment;

DETAILED DESCRIPTION OF THE INVENTION

First Embodiment

Each of FIGS. 1 to 4 is an imaginary diagram of the whole of a chip to help explain the well structure of a semiconductor integrated circuit device according to a first embodiment of the present invention. The procedure shown in FIGS. 1 to 4 helps explain the final well structure in an easy-to-understand manner and is not for forming actual well regions. FIGS. 1 to 4 do not show the arrangement of actual well regions.

Figure 1:
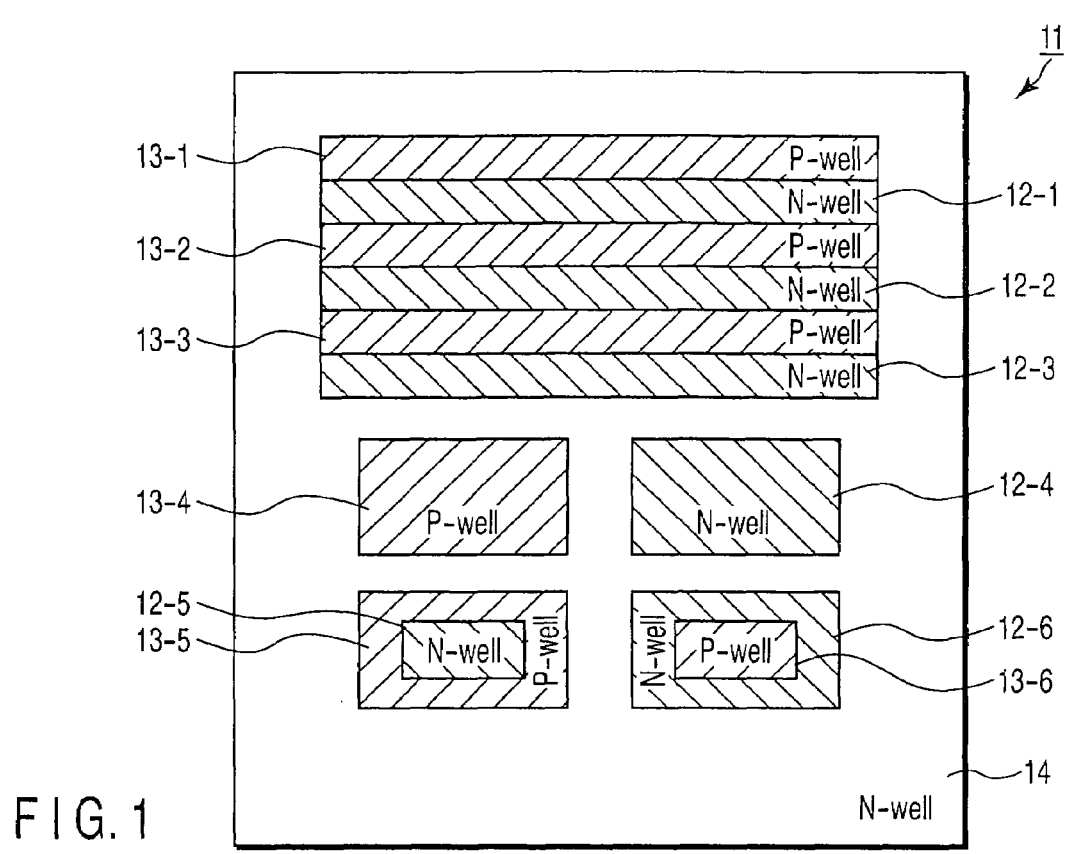
FIG. 1 is a first imaginary diagram of the whole of a chip to help explain the well structure of a semiconductor integrated circuit device according to a first embodiment of the present invention.

(1) As shown in FIG. 1, in a chip (p-type semiconductor substrate) 11, n-well regions 12-1 to 12-6 and p-well regions 13-1 to 13-6 are selectively formed and all of the remaining region (excluding the p-well regions) is an n-well region 14. The n-well regions 12-1 to 12-3 and the p-well regions 13-1 to 13-3 are provided alternately in such a manner that an n-well region adjoins a p-well region. The n-well region 12-4 and p-well region 13-4 are independent regions. The n-well region 12-5 is enclosed by the p-well region 13-5. The p-well region 13-6 is enclosed by the n-well region 12-6. In each of the n-well regions 12-1 to 12-6, a p-channel MOS transistor is formed. In each of the p-well regions 13-1 to 13-6, an n-channel MOS transistor is formed.

Figure 2:
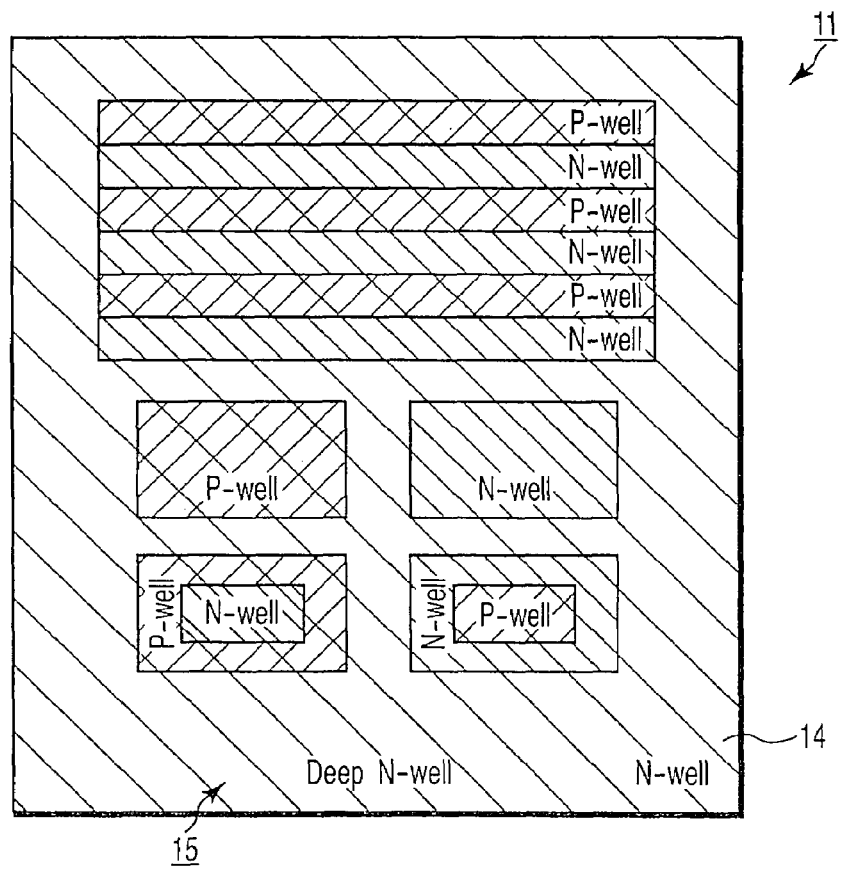
FIG. 2 is a second imaginary diagram of the whole of a chip to help explain the well structure of a semiconductor integrated circuit device according to the first embodiment.

(2) In the well structure shown in FIG. 1, a deep n-well region 15 is formed at the entire surface of the chip 11 as shown in FIG. 2. As a result, the deep n-well region 15 connects the n-well regions 12-1 to 12-6, 14 to one another. In addition, the p-well regions 13-1 to 13-6 are separated electrically from the semiconductor substrate 11.

Figure 3:
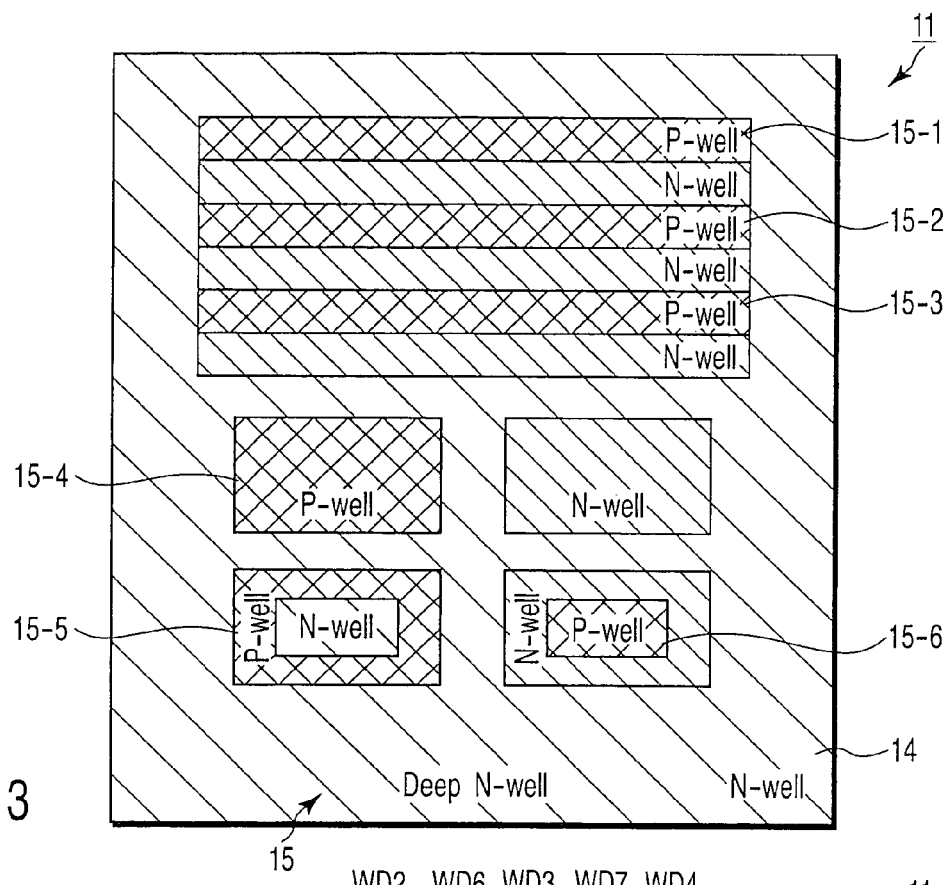
FIG. 3 is a third imaginary diagram of the whole of a chip to help explain the well structure of a semiconductor integrated circuit device according to the first embodiment.

(3) As shown in FIG. 3, at least part of the deep n-well regions 15-1 to 15-6 under the p-well regions 13-1 to 13-6 are removed, thereby forming windows. The shape and size of each of the windows are determined according to predetermined rules.

Figure 4:
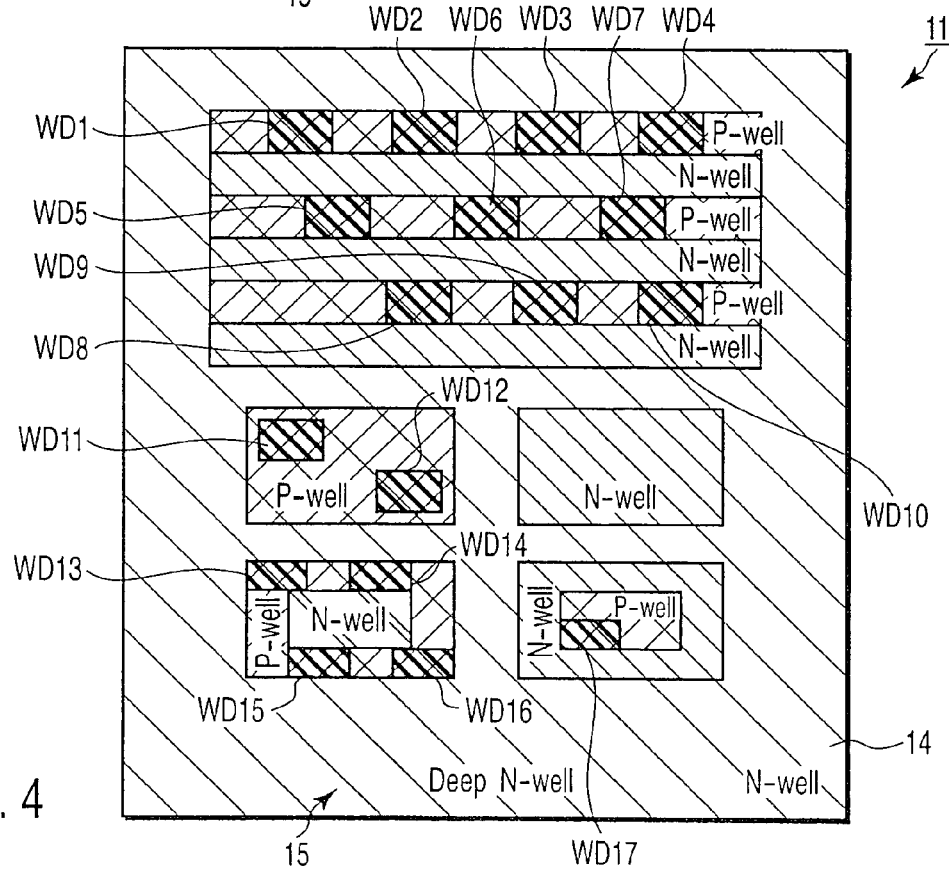
FIG. 4 is a fourth imaginary diagram of the whole of a chip to help explain the well structure of a semiconductor integrated circuit device according to the first embodiment.

(4) As shown in FIG. 4, when windows WD1 to WD17 are formed in the deep well region 15, all of the p-well regions 13-1 to 13-6 are connected electrically via the windows WD1 to WD17 to the p-type semiconductor substrate 11.

Specifically, the deep n-well region 15 connects all of the n-well regions 12-1 to 12-6, 14 to one another and all of the p-well regions 13-1 to 13-6 equally to the p-type semiconductor substrate 11. For example, as shown in FIG. 1, the well bias potential is also applied via the deep n-well region 15 to the n-well region 12-5 enclosed by the p-well region 13-5. As a result, the back gates of all of the n-channel MOS transistors and those of all of the p-channel MOS transistors in the chip 11 are connected to one another.

Accordingly, it is possible to apply a back gate bias (or well bias potential) from an arbitrary place. Using an empty region of the layout pattern as an arbitrary place prevents the die size from being made larger.

Figure 5:
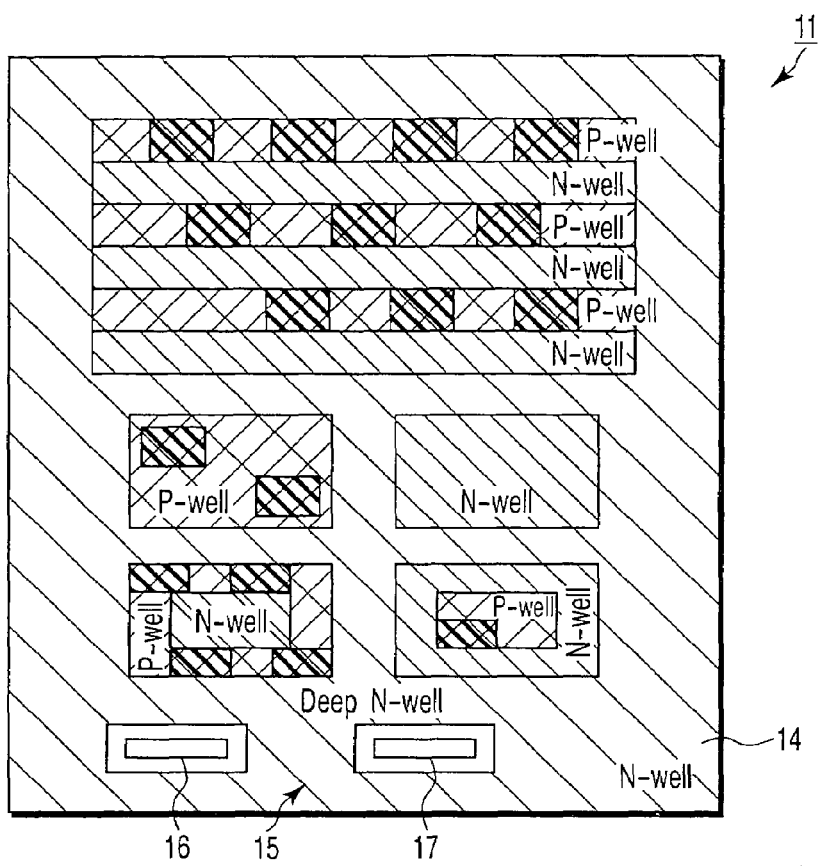
FIG. 5 is an imaginary diagram of the whole of a chip in applying a back gate bias, which helps explain the well structure of a semiconductor integrated circuit device according to the first embodiment.

In FIG. 5, a p-well region bias potential is applied at a terminal 16 formed in the empty region of the layout pattern. An n-well region bias potential is applied at a terminal 17. While the p-well region bias potential and n-well region bias potential are applied at the terminals 16, 17, respectively, these bias potentials may be applied at a plurality of terminals as needed.

With this configuration, the deep n-well region 15 can be used as part of wiring, which enables four-terminal MOS transistors to be formed without making the die size larger.

Various rules for removing the deep n-well region 15, in other words, rules for forming windows WD1 to WD17, can be considered. A first example is such that a decision is made according to the junction resistance of a p-well region and the p-type semiconductor substrate. A second example is such that a decision is made so as to prevent the characteristics of a transistor from deteriorating.

The second example will be explained in further detail. At the boundary (the periphery of the deep n-well region 15 corresponding to the windows WD1 to WD17) between a place where the deep n-well region exists and a place where the deep n-well region does not exist under a p-well region, the impurity concentration in each of the p-well regions 12-1 to 13-6 varies, which can vary the threshold voltage of the MOS transistor formed on the corresponding region. To avoid the effect of such a variation, MOS transistors should be provided so as to keep away from the boundary. In other words, the windows WD1 to WD17 should be provided in positions where the boundary corresponds to the place under the element isolating region.

Figure 6A:
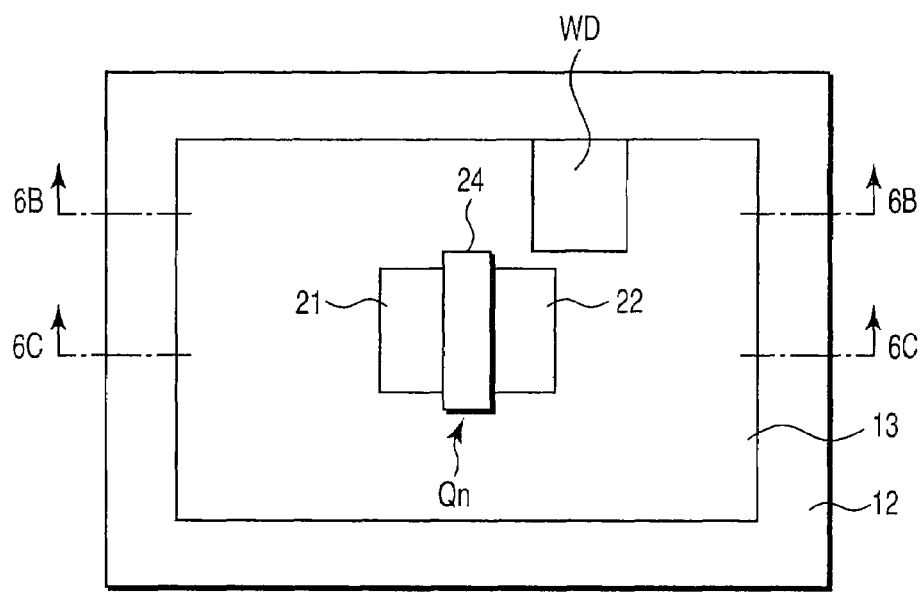
FIG. 6A is a plan view showing the structure of an n-channel MOS transistor together with its peripheral circuit, focusing on one p-well region in the LSI shown in each of FIGS. 1 to 5.
Figure 6B:
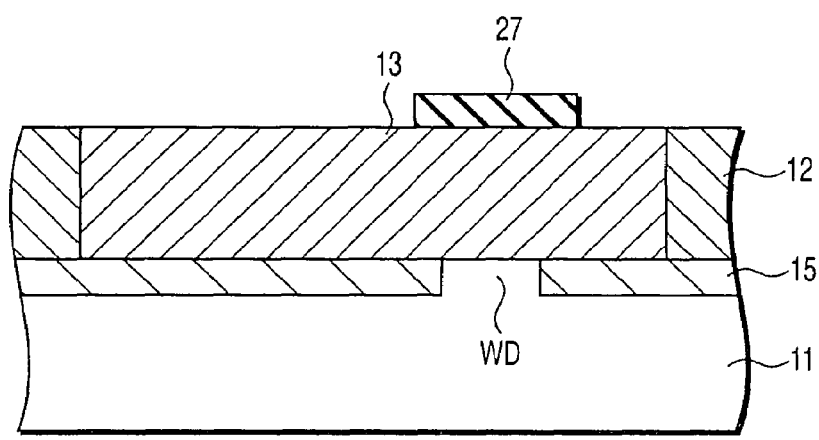
FIG. 6B is a sectional view taken along line 6B-6B of FIG. 6A.
Figure 6C:
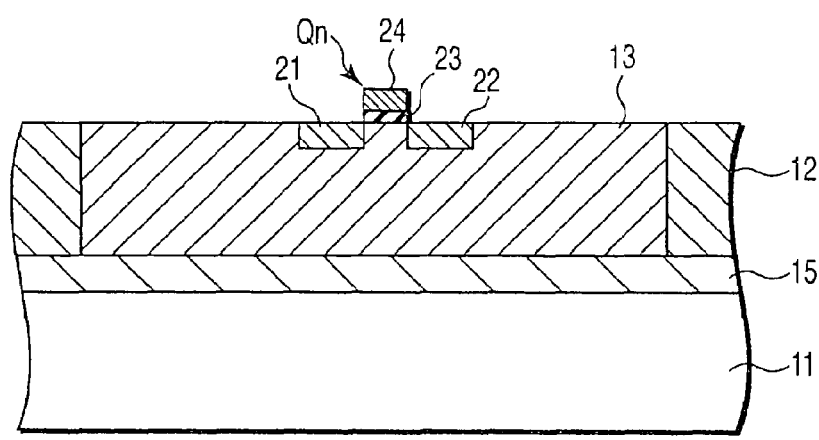
FIG. 6C is a sectional view taken along line 6C-6C of FIG. 6A.

FIGS. 6A, 6B, and 6C are a plan view and sectional views, respectively, showing the configuration of an n-channel MOS transistor together with its peripheral circuit, focusing on one p-well region in an LSI shown in FIGS. 1 to 5. FIG. 6A is a plan view of a pattern. FIG. 6B is a sectional view taken along line 6B-6B of FIG. 6A. FIG. 6C is a sectional view taken along line 6C-6C in FIG. 6A.

In the p-well region 13, n-type impurity diffused layers 21, 22 functioning as the source and drain regions of an n-channel MOS transistor Qn are formed. On the substrate 11 between the diffused layers 21, 22, a gate insulating film 23 is formed. On the gate insulating film 23, a gate electrode 24 is formed.

The deep n-well region 15 is formed in the substrate 11 under the p-well region 13 and n-well region 12. In the deep n-well region 15, a window WD is made. The p-well region 13 is connected electrically to the substrate 11 via the window WD of the deep n-well region 15. To prevent the boundary of the window WD from overlapping with the MOS transistor Qn, the boundary is provided below the element isolating region 27. The deep n-well region 15 is used as wiring for connecting said plurality of n-well regions 12 to one another. The reason why the deep n-well region is used for wire connection is to decrease the resistance value and to electrically connect the n-well regions 12 enclosed by the p-well region 13 to one another. To connect the p-well regions 13 to one another, the p-type semiconductor substrate 11 is used.

With the above configuration, all of the n-well regions 12 can be regarded as being connected electrically to one another to form one region. Applying a well bias potential from an arbitrary place enables a MOS transistor to have four terminals without increasing the die size. As a result, the back gate potential of the MOS transistor can be made different from the source potential, which makes it possible to realize a semiconductor integrate circuit device (LSI) capable of adjusting the threshold voltage Vth of a MOS transistor.

While in the above explanation, the p-type semiconductor substrate 11 has been used, the present invention may, of course, be applied to a case where n-well regions, p-well regions, and deep n-well regions are formed in an n-type semiconductor substrate.

Furthermore, while the entire surface of the chip 11 has been covered with the n-well region 14, the entire surface is not necessarily covered with the n-well region. The reason is that forming a deep n-well region 15 on the entire surface of the chip 11 enables all of the n-well regions to be connected to one another by the deep n-well region 15.

Second Embodiment

Figure 7:
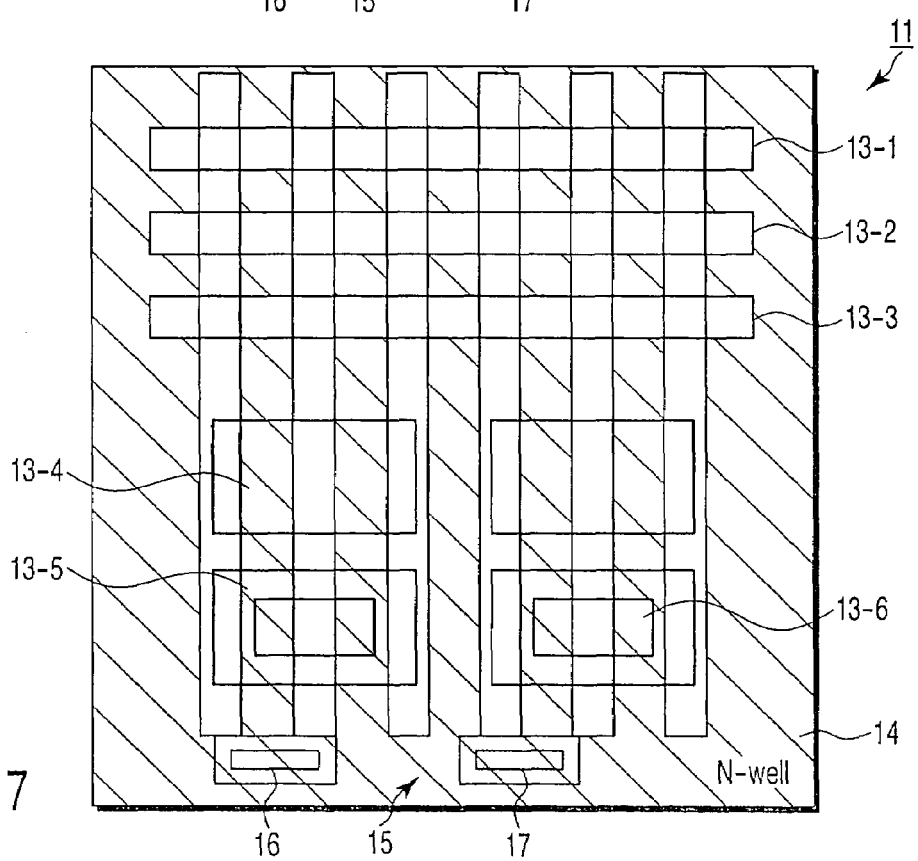
FIG. 7 is an imaginary diagram of the whole of a chip to help explain a semiconductor integrated circuit device according to a second embodiment of the present invention.
Figure 8A:
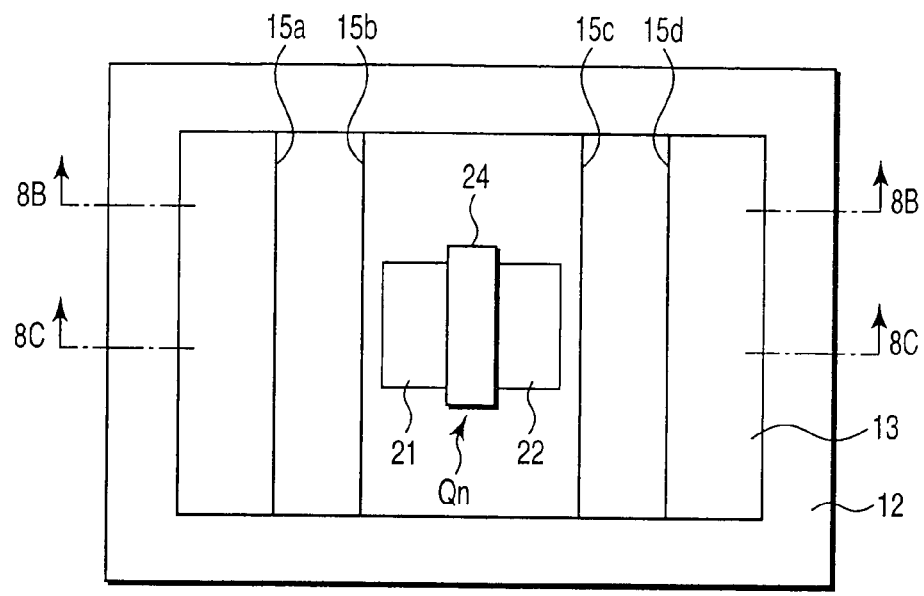
FIG. 8A is a plan view showing the structure of an n-channel MOS transistor together with its peripheral circuit, focusing on one p-well region in FIG. 7.
Figure 8B:
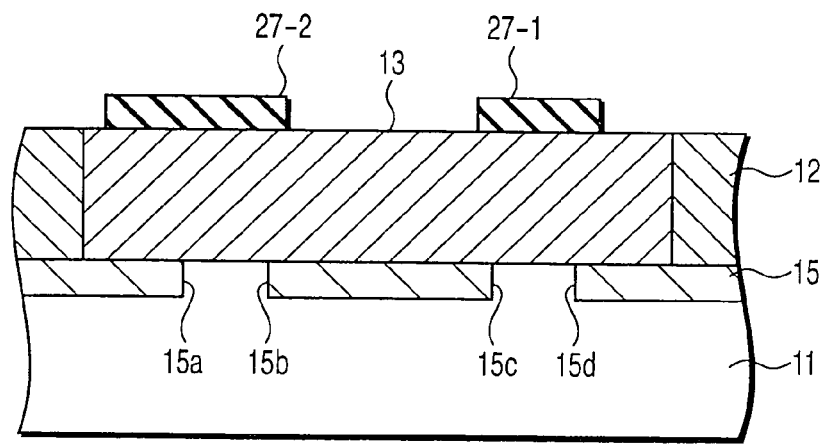
FIG. 8B is a sectional view taken along line 8B-8B of FIG. 8A.
Figure 8C:
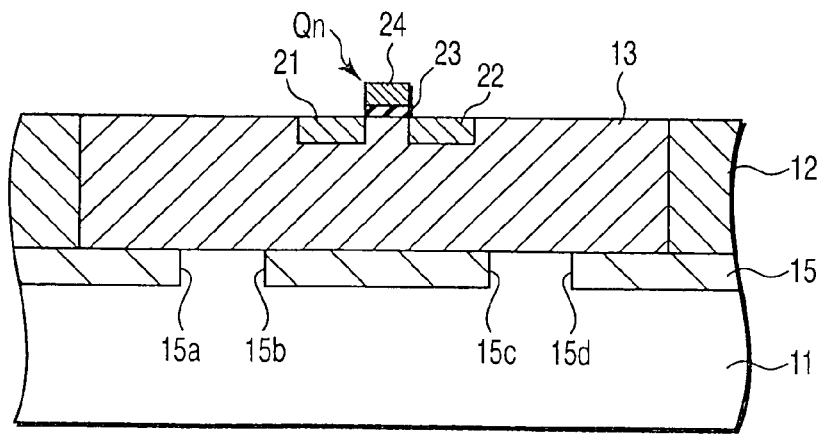
FIG. 8C is a sectional view taken along line 8C-8C of FIG. 8A.

FIG. 7 and FIGS. 8A, 8B, and 8C are for explaining a semiconductor integrated circuit device according to a second embodiment of the present invention. FIG. 7 is an imaginary diagram of the whole of a chip. FIGS. 8A, 8B, and 8C are a plan view and sectional views, respectively, showing the configuration of an n-channel MOS transistor together with its peripheral circuit, focusing on one p-well region in FIG. 7. FIG. 8A is a plan view of a pattern. FIG. 8B is a sectional view taken along line 8B-8B of FIG. 8A. FIG. 8C is a sectional view taken along line 8C-8C of FIG. 8A.

While in the first embodiment, the windows WD (WD1 to WD17) have been made in the deep n-well region 15, strip-like deep n-well regions 15 are formed, connected electrically to one another, and arranged in parallel with one another as shown in FIG. 7 in the second embodiment. Alternatively, strip-like windows are regarded as being made in the deep n-well region 15. Moreover, in the example of FIG. 7, part of the p-well regions 13-1 to 13-3, which are also shaped like strips, are provided in parallel with one another in a direction crossing the deep n-well region 15.

At the surface excluding the p-well regions and deep n-well region, an n-well region 14 is formed. Then, a p-well region bias potential is applied at a terminal 16 formed in the empty region of the layout pattern. An n-well region bias potential is applied at a terminal 17. While the p-well region bias potential and n-well region bias potential are applied at the terminals 16, 17, respectively, these bias potentials may be applied at a plurality of terminals as needed.

In the p-well region 13 shown in each of FIGS. 8A, 8B, and 8C, n-type impurity diffused layers 21, 22 functioning as the source and drain regions of an n-channel MOS transistor Qn are formed. On the substrate 11 between the diffused layers 21, 22, a gate insulating film 23 is formed. On the gate insulating film 23, a gate electrode 24 is formed.

The deep n-well regions 15 are formed in the substrate 11 under the p-well region 13 and n-well region 12 in such a manner that they are shaped like strips and arranged in parallel with one another. The p-well region 13 is connected electrically to the substrate 11 via the region between the strip-like deep n-well regions 15. To prevent the edge (boundary) of each of the deep n-well regions 15a, 15b, 15c, 15d, . . . from overlapping with the MOS transistor Qn, the boundaries 15a, 15b, 15c, 15d, . . . are provided below the element isolating regions 27-1, 27-2.

Since the above configuration is basically the same as that of the first embodiment, four-terminal MOS transistors can be formed without making the die size larger. In addition, the back gate potential of the MOS transistor can be made different from the source potential, which makes it possible to realize a semiconductor integrated circuit device (LSI) capable of adjusting the threshold voltage Vth of the transistor.

While in the second embodiment, the strip-like deep n-well regions 15 have been arranged in parallel longitudinally, they may, of course, be arranged in parallel laterally.

Third Embodiment

Figure 9A:
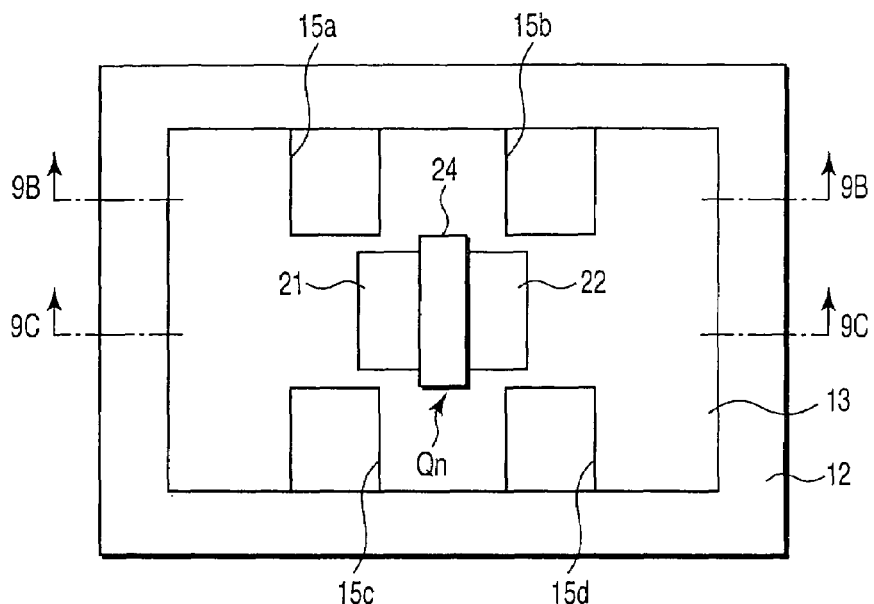
FIG. 9A is a plan view showing the structure of an n-channel MOS transistor together with its peripheral circuit, focusing on one p-well in an LSI, which helps explain a semiconductor integrated circuit device according to a third embodiment of the present invention.
Figure 9B:
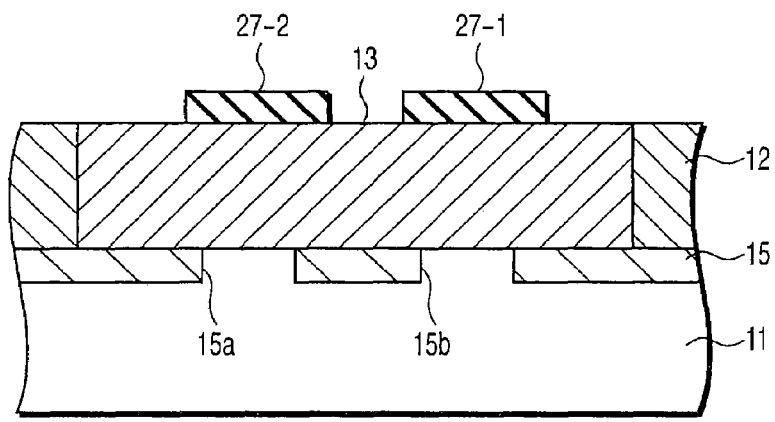
FIG. 9B is a sectional view taken along line 9B-9B of FIG. 9A.
Figure 9C:
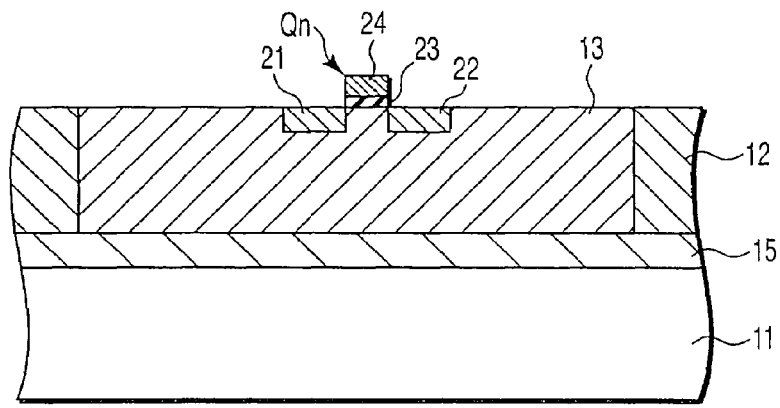
FIG. 9C is a sectional view taken along line 9C-9C of FIG. 9A.

FIGS. 9A, 9B, and 9C are for explaining a semiconductor integrated circuit device according to a third embodiment of the present invention. FIGS. 9A, 9B, and 9C are a plan view and sectional views, respectively, showing the configuration of an n-channel MOS transistor together with its peripheral circuit, focusing on one p-well region in an LSI. FIG. 9A is a plan view of a pattern. FIG. 9B is a sectional view taken along line 9B-9B of FIG. 9A. FIG. 9C is a sectional view taken along line 9C-9C of FIG. 9A. An imaginary diagram of the whole of a chip is basically the same as that of FIG. 7, except that the deep n-well region is shaped like a lattice.

Specifically, as shown in FIGS. 9A, 9B, and 9C, a lattice-like deep n-well region 15 is provided under the p-well region 13. To prevent the edges 15a, 15b, 15c, 15d, . . . of the deep n-well region 15 from overlapping with a MOS transistor Qn, the edges 15a, 15b, 15c, 15c, . . . are provided below the element isolating regions 27-1, 27-2.

Even this configuration produces the same effects as those of the first and second embodiments.

Fourth Embodiment

In the first embodiment, a single power supply (VDD and GND) has been used. In LSI, however, a plurality of power supplies are often used. In a fourth embodiment of the present invention, a well structure that uses a plurality of types of power supplies is shown.

When a plurality of types of power supplies are required in LSI, the lowest potential with respect to the ground potential GND is the core voltage in an example of an MPU. The circuits to which the core voltage is applied include a computing unit, a control circuit, and a cache circuit, each having a large number of transistors. The circuits which use a potential higher than the core voltage include an interface circuit, a PLL circuit, and other analog circuits.

Since these circuits use potentials different from the core voltage, the n-well regions cannot be shared. As for the p-well regions, the core voltage section is often separated from the analog voltage section to improve the circuit characteristics. Furthermore, to reduce the drawn current, the reduction of current in the core voltage section is the most effective since the core voltage section consumes current most.

Taking these into account, the well region in the circuit section using the core voltage is separated from the well region in the circuit section using a voltage different from the core voltage. Using FIGS. 10 to 16, explanation will be given about a well structure that uses four-terminal transistors in the core section without increasing the die size as in the first embodiment, thereby controlling the back gate bias in a centralized manner. As in FIGS. 1 to 4, the procedure shown in FIGS. 10 to 16 helps explain the final well structure in an easy-to-understand manner and is not for forming actual well regions. The same parts as those in FIGS. 1 to 4 are indicated by the same reference numerals and a detailed explanation of them will be omitted.

Figure 10:
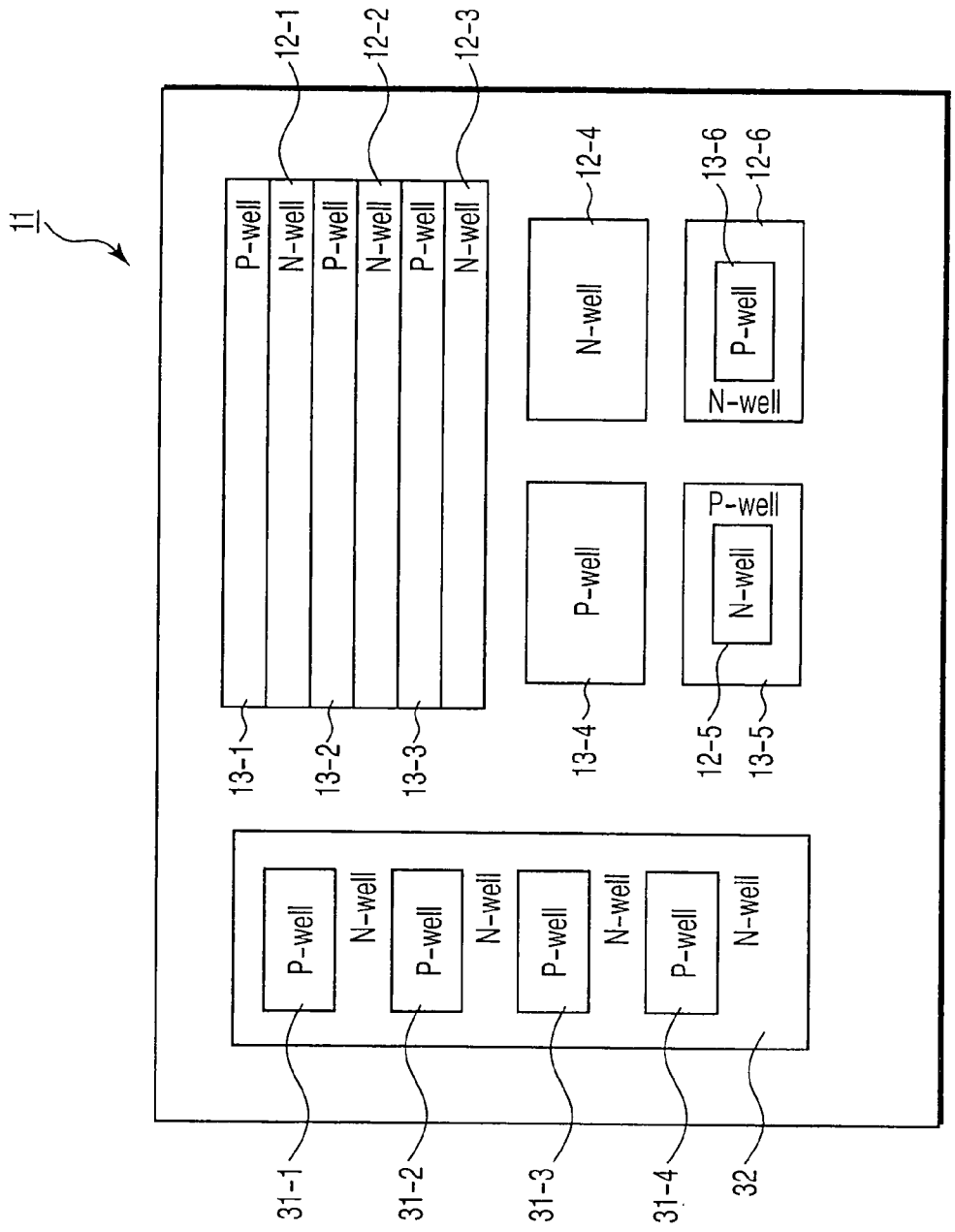
FIG. 10 is a first imaginary diagram of the whole of a chip to help explain the well structure of a semiconductor integrated circuit device according to a fourth embodiment of the present invention.

(1) As shown in FIG. 10, an n-well region 32 is formed so as to enclose p-well regions 31-1 to 31-4 using voltages different from the core voltage.

Figure 11:
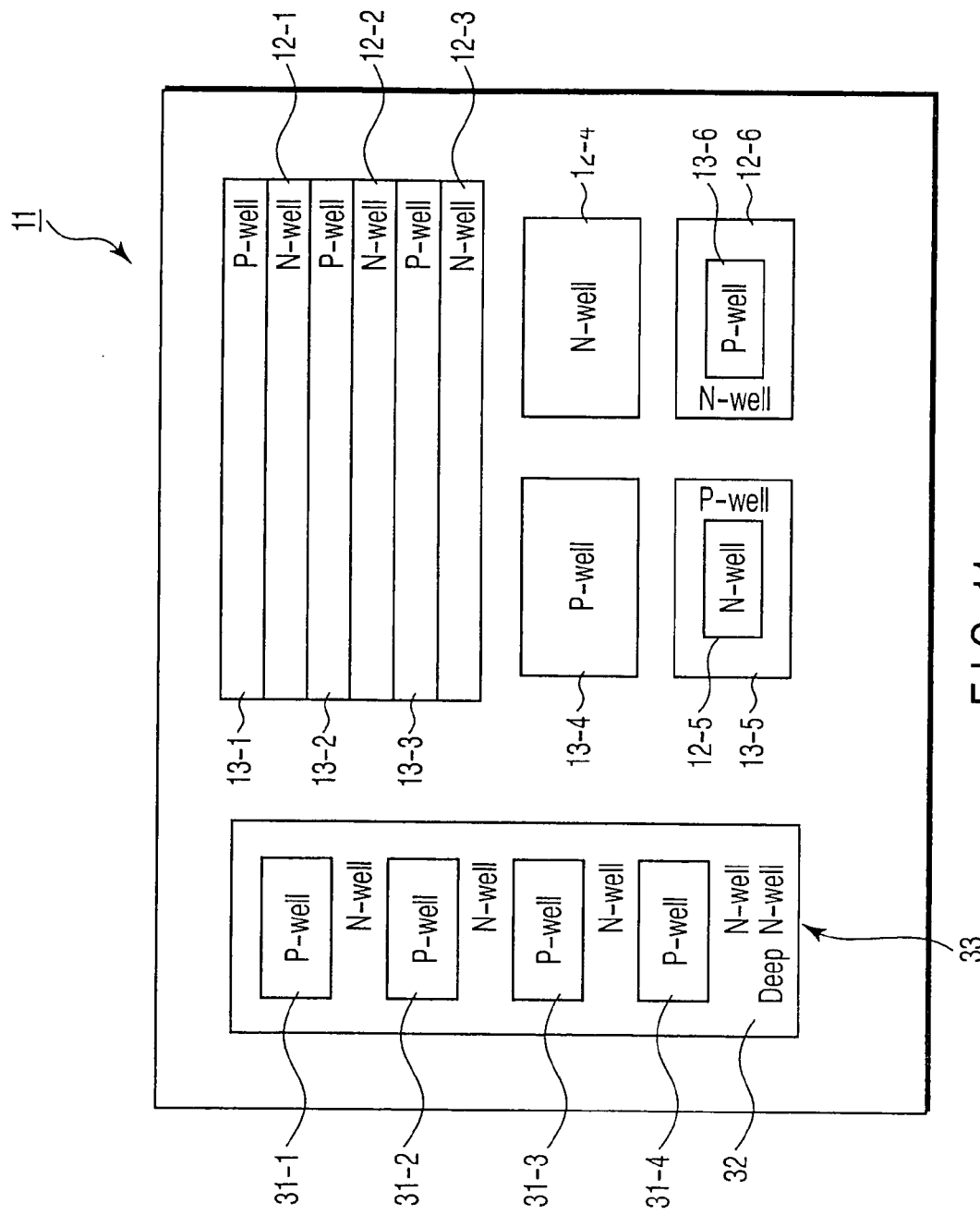
FIG. 11 is a second imaginary diagram of the whole of a chip to help explain the well structure of a semiconductor integrated circuit device according to the fourth embodiment.

(2) As shown in FIG. 11, a deep n-well region 33 is formed under the p-well regions 31-1 to 31-4 and n-well region 32 and then the p-well regions 31-1 to 31-4 are separated electrically from the substrate 11. Of course, they are not necessarily separated from the substrate 11.

Figure 12:
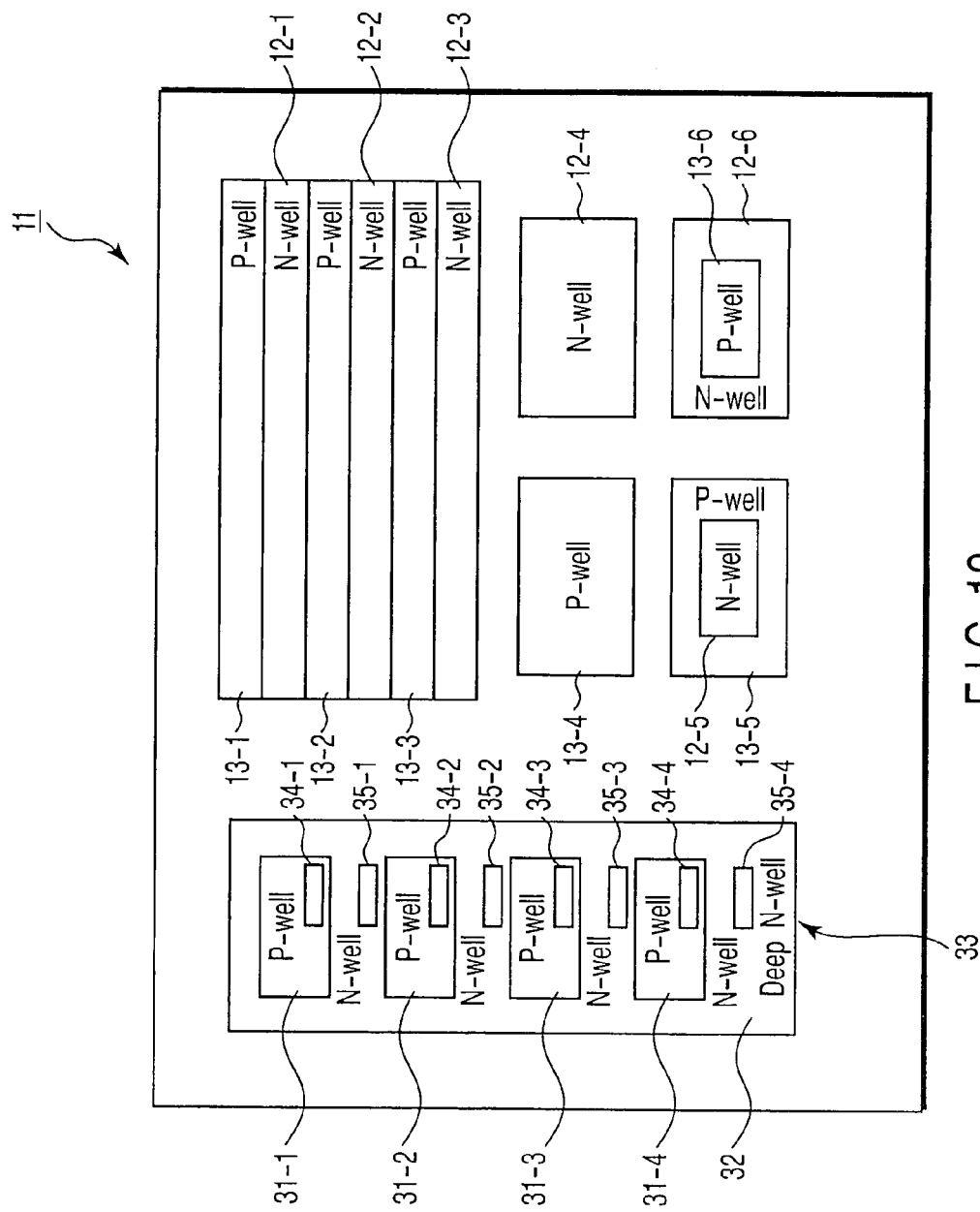
FIG. 12 is a third imaginary diagram of the whole of a chip to help explain the well structure of a semiconductor integrated circuit device according to the fourth embodiment.

(3) As shown in FIG. 12, well bias potentials are applied from terminals 34-1 to 34-4 and terminals 35-1 to 35-4 to the p-well regions 31-1 to 31-4 and n-well region 32 using voltages different from the core voltage. In this case, the source potential and back gate potential of the n-channel MOS transistor formed in each of the p-well regions 31-1 to 31-4 become equal to each other and the source potential and back gate potential of the p-channel MOS transistor formed in the n-well region 32 become equal to each other.

Figure 13:
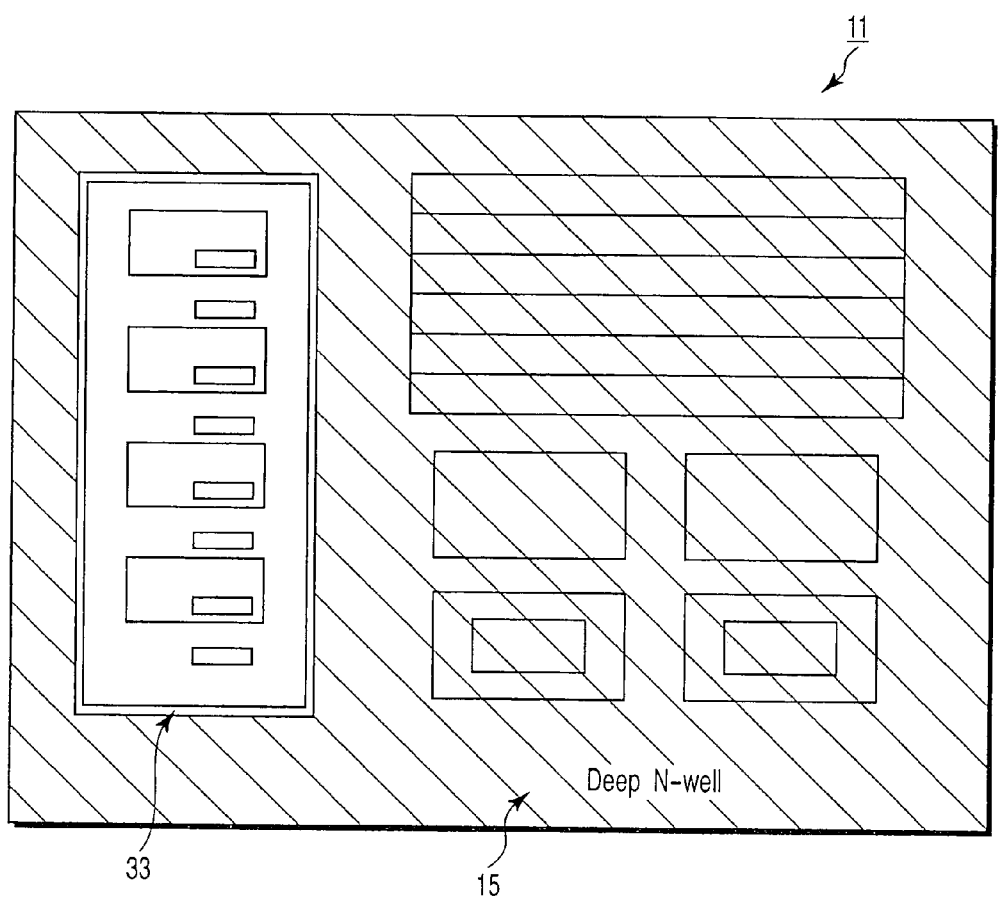
FIG. 13 is a fourth imaginary diagram of the whole of a chip to help explain the well structure of a semiconductor integrated circuit device according to the fourth embodiment.

(4) As shown in FIG. 13, a deep n-well region 15 is formed under the region using the core voltage in which the n-well regions 12-1 to 12-6 and p-well regions 13-1 to 13-6 have been formed in the substrate 11. As a result, the deep n-well region 15 connects all of the n-well regions 12-1 to 12-6 using the core voltage to one another. The p-well regions 13-1 to 13-6 are separated electrically from the substrate.

Figure 14:
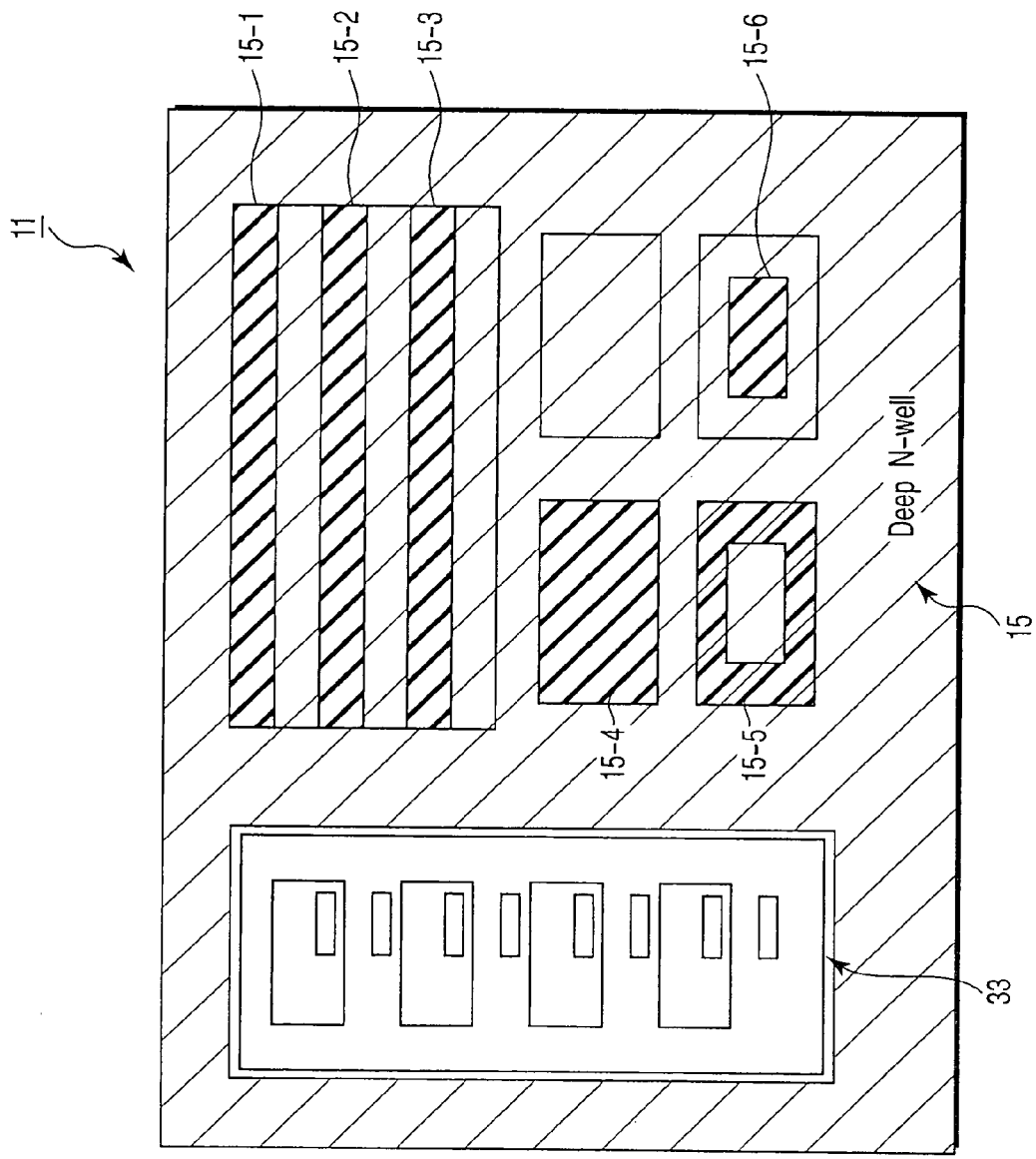
FIG. 14 is a fifth imaginary diagram of the whole of a chip to help explain the well structure of a semiconductor integrated circuit device according to the fourth embodiment.

(5) As shown in FIG. 14, a part of the deep n-well regions 15-1 to 15-6 under the p-well regions 13-1 to 13-6 are removed, thereby forming windows. The shape and size of each of the windows is determined according to predetermined rules.

Figure 15:
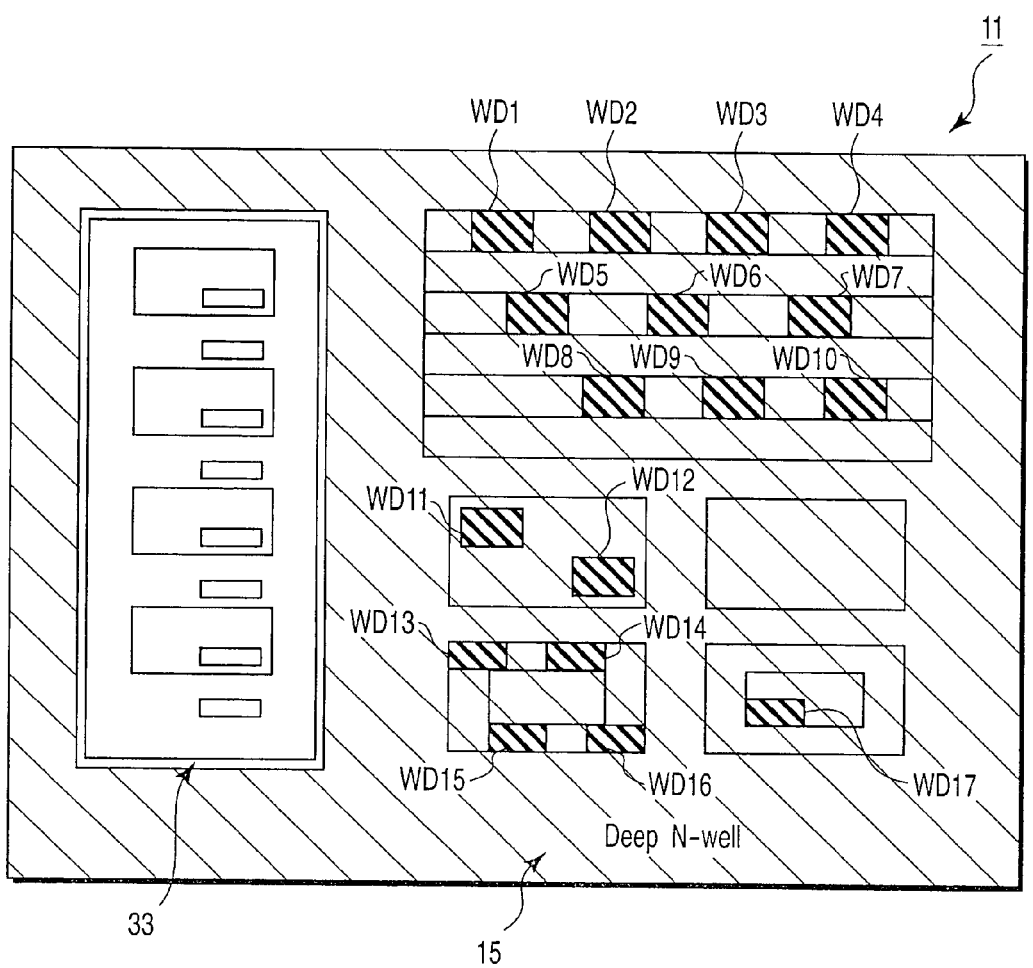
FIG. 15 is a sixth imaginary diagram of the whole of a chip to help explain the well structure of a semiconductor integrated circuit device according to the fourth embodiment.

(6) As shown in FIG. 15, windows WD1 to WD17 are made in the deep n-well region 15. Then, all of the p-well regions 13-1 to 13-6 are connected electrically to the p-type semiconductor substrate 11 via the windows WD1 to WD17.

Specifically, all of the n-well regions 12-1 to 12-6, 14 formed in the region using the core voltage are connected to one another by the deep n-well region 15. As a result, the back gates of the n-channel MOS transistors and those of the p-channel MOS transistors formed in the region using the core voltage in the chip 11 are connected to one another.

Therefore, a back gate bias (or well bias voltage) can be applied from arbitrary places to the MOS transistors in the region using the core voltage. In addition, a different back gate bias can be applied to the back gates of the MOS transistors in the region using a voltage different from the core voltage. The empty regions of the layout pattern are used as the arbitrary places, preventing the die size from increasing.

In FIG. 16, the p-well region bias potential is applied at the terminal 16 formed in the empty region of the layout pattern and the n-well region bias potential is applied at the terminal 17. While the p-well region bias potential and n-well region bias potential are applied at the terminals 16, 17, respectively, these bias potentials may be applied at a plurality of terminals as needed.

As described above, even when a plurality of types of power supplies are used, the well region is formed so as to be one (or more than one) back gate electrically connected to the relevant power supply (in this case, the core voltage). The well bias potential is applied from an arbitrary place (or arbitrary places), which enables four-terminal MOS transistors to be formed without increasing the die size. As a result, the back gate potential of the MOS transistor can be made different from the source potential, which makes it possible to realize an LSI capable of adjusting the threshold voltage Vth of the MOS transistor with respect to the relevant power supply.

While in the fourth embodiment, the p-type semiconductor substrate 11 has been used, the present invention may, of course, be applied to a case where n-well regions, p-well regions, and deep n-well regions are formed in an n-type semiconductor substrate.

Fifth Embodiment

Figure 17:
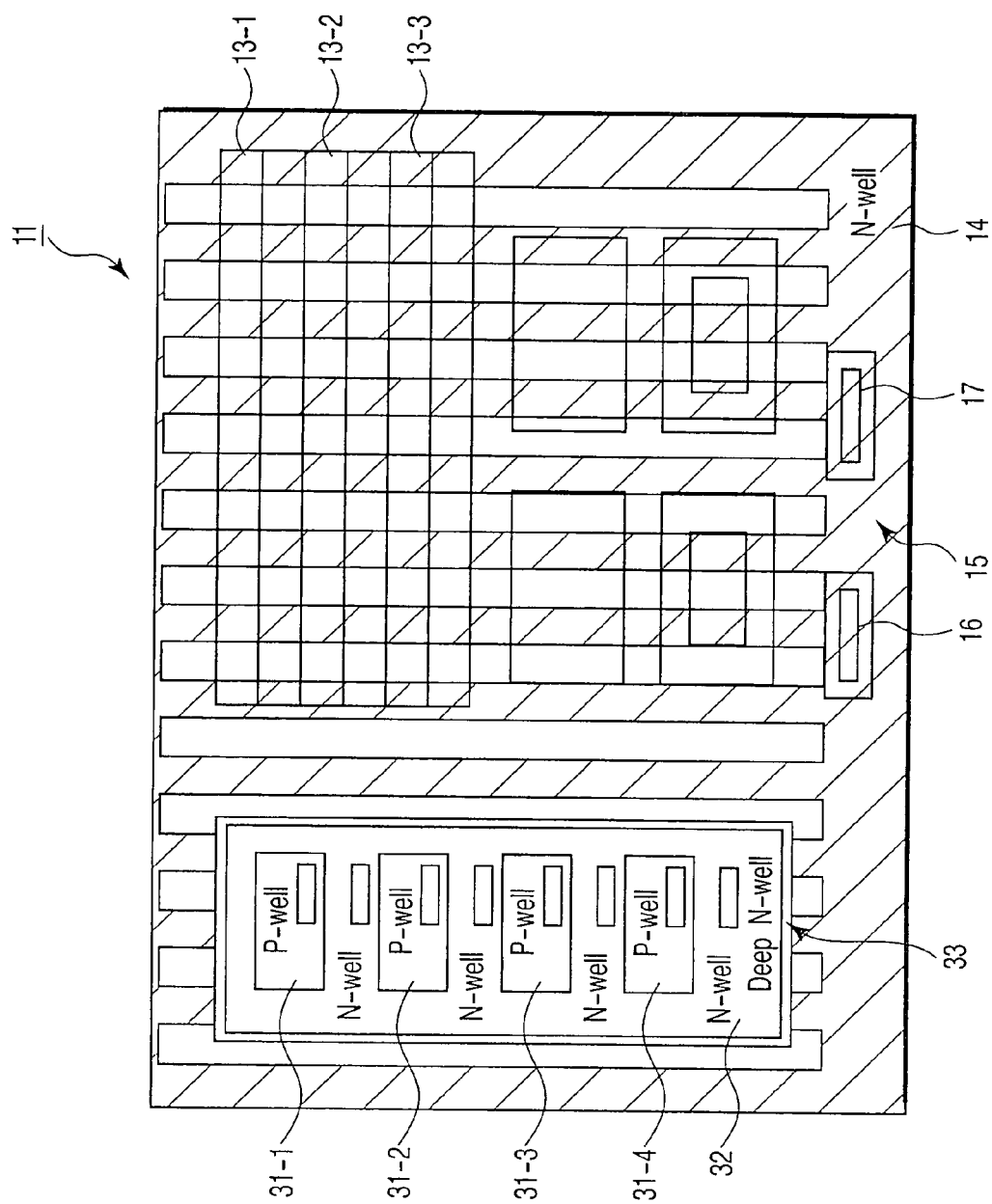
FIG. 17 is an imaginary diagram of the whole of a chip to help explain a semiconductor integrated circuit device according to a fifth embodiment of the present invention.

FIG. 17 is an imaginary diagram of the whole of a chip to help explain a semiconductor integrated circuit device according to a fifth embodiment of the present invention.

In the fourth embodiment, the windows have been made in the deep n-well regions. As shown in FIG. 17, in the fifth embodiment, the deep n-well region 15 is shaped like strips, which are connected electrically to one another and arranged in parallel with one another. Alternatively, strip-like windows may be regarded as being made in the deep n-well region 15. In the example of FIG. 17, part of the p-well regions 13-1 to 13-3 are also shaped like strips. The strip-like p-well regions are arranged in parallel in a direction crossing the deep n-well region 15.

At the entire surface of (the regions using the core voltage of) the chip excluding the p-well regions 31-1 to 31-4, n-well region 32, and deep n-well regions 33, an n-well region 14 is formed. Then, the p-well region bias potential is applied from the terminal 16 formed in the empty region of the layout pattern and the n-well region bias potential is applied from the terminal 17. While the p-well region bias potential and n-well region bias potential are applied at the terminals 16, 17, respectively, these bias potentials may be applied at a plurality of terminals as needed.

Even such a configuration produces the same effect as that of the fourth embodiment.

The strip-like deep n-well regions may be arranged laterally. As in the third embodiment, the deep n-well region may be shaped like a lattice.

Example of Application

Next, an application of a semiconductor integrated circuit device according to the first to fifth embodiments will be explained using a drawing device as an example.

Figure 18:
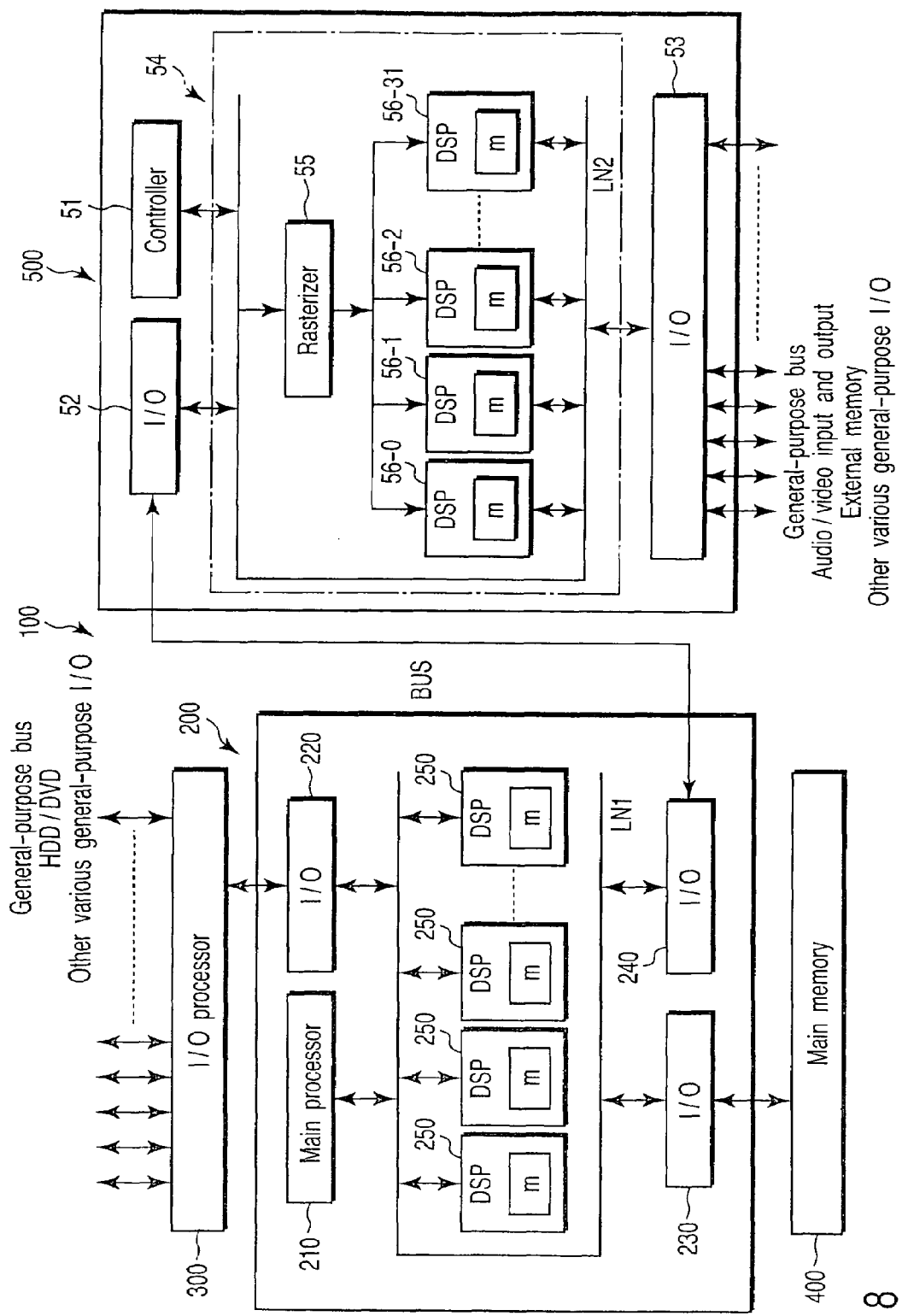
FIG. 18 is a block diagram of a graphic processor system LSI to help explain an application of a semiconductor integrated circuit device according to each of the first to fifth embodiments.

FIG. 18 is a block diagram of a graphic processor system LSI. The graphic processor system LSI 100 comprises a host processor 200, an I/O processor 300, a main memory 400, and a graphic processor 500. The host processor 200 and graphic processor 500 are connected to each other by a processor bus BUS in such a manner that they can communicate with each other.

The host processor 200 includes a main processor 210, I/O sections 220 to 240, and a plurality of digital signal processors (DSPs) 250. These circuit blocks are connected to one another by a local network LN1 in such a manner that they can communicate with one another. The main processor 210 controls the operation of each of the circuit blocks in the host processor 200. The I/O section 220 exchanges data with an external unit outside the host processor 200 via the I/O processor 300. The I/O section 230 exchanges data with the main memory 400. The I/O section 240 exchanges data with the graphic processor 500 via the processor bus BUS. The digital signal processors 250 perform signal processing on the basis of the data read from the main memory 400 or an external unit.

The I/O processor 300 connects the host processor 200 to, for example, a general-purpose bus, peripheral units, including an HDD and a DVD (Digital Versatile Disc), and a network. In this case, the peripheral units may be mounted on the LSI 100 or provided outside the LSI 100.

The main memory 400 holds the necessary program for the host processor 200 to operate. The program is read from, for example, an HDD (not shown), and is stored in the main memory 400.

The graphic processor 500 includes a controller 51, I/O sections 52, 53, and an arithmetic processing section 54. The controller 51 controls the communication with the host processor 20 and the arithmetic processing section 54. The I/O section 52 supervises the input and output to and from the host processor 20 via the processor bus BUS. The I/O section 53 supervises the input and output of various general-purpose buses, including PCI, video and audio, and to and from an external memory. The arithmetic processing section 54 makes image processing calculations.

The arithmetic processing section 54 includes a rasterizer 55 and a plurality of signal processors 56-0 to 56-31. Although the number of signal processors 56 is 32 in the arithmetic processing section 54, it is illustrative and not restrictive. For instance, the number of signal processors 56 may be 8, 16, or 64.

Figure 19:
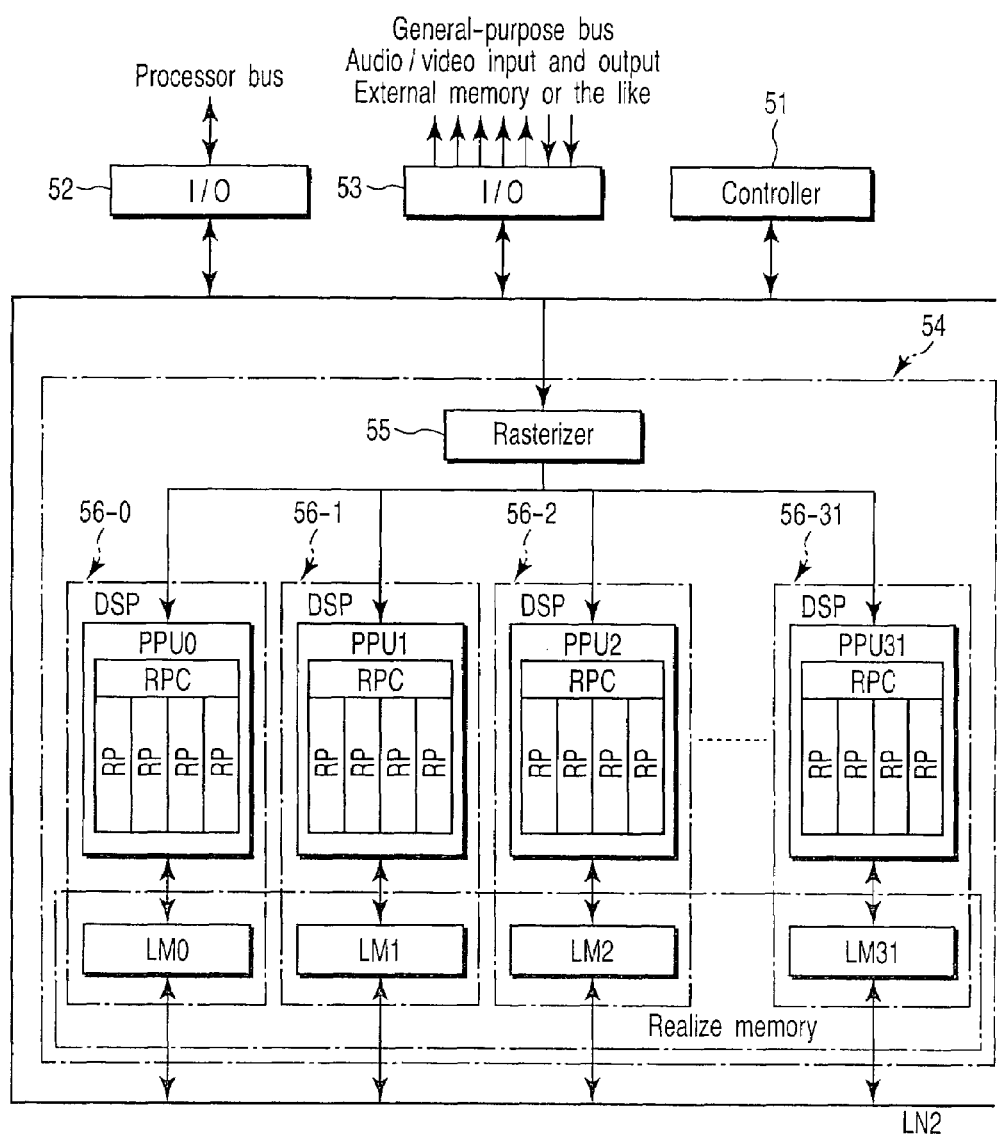
FIG. 19 is a block diagram to help explain a detailed configuration of the graphic processor in the circuit shown in FIG. 18.

Next, using FIG. 19, a detailed configuration of the graphic processor 500 in the circuit of FIG. 18 will be explained. The arithmetic processing section 54 includes the rasterizer 55 and 32 signal processors 56-0 to 56-31. The rasterizer 55 creates pixels according to the input graphic data. A pixel is the smallest unit area handled in drawing a specific picture. A picture is represented by a set of pixels. The pixels created are determined by the shape of a picture (or the positions occupied by the picture). Specifically, when a certain position is drawn, a pixel corresponding to the position is created. When another position is created, another pixel corresponding to the position is created. The signal processors 56-0 to 56-31 include pixel processing units PPU0 to PPU31 and local memories LM0 to LM31 provided in the corresponding pixel processing units, respectively.

Each of the pixel processing units PPU0 to PPU31 includes four realize pipes RP. Four realize pipes constitute one RP cluster RPC (realize pipe cluster). Each of the RP clusters RPC carries out an SIMD (Single Instruction Multiple Data) operation, thereby processing four pixels at a time. The pixels corresponding to the individual positions of the picture are allocated to the corresponding pixel processing units PPU0 to PPU31. According to the position occupied by the picture, the corresponding pixel processing units PPU0 to PPU31 process the pixels.

The local memories LM0 to LM31 store the pixel data create by the pixel processing units PPU0 to PPU31. The local memories LM0 to LM31 constitute a realize memory as a whole. The realize memory is, for example, a DRAM. The individual memory regions having a specific data width in the DRAM correspond to the local memories LM0 to LM31, respectively.

In the graphic processor system LSI configured as described above, a semiconductor integrated circuit device according to the first to fifth embodiments is applied to the analog circuits excluding the memory, SRAM, and logic circuits, including the main processor 210, controller 51, rasterizer 55, which reduces the pattern occupied area of these circuit sections and therefore enables large-scale integration.

As described above, the deep n-well regions used to separate the p-well regions electrically from the semiconductor substrate in the prior art are used as a part of the wiring for connecting the n-well regions to one another. Moreover, the deep n-well regions are formed in such a manner that a part of the deep n-well regions under the p-well regions are removed, which enables the p-well regions to be connected electrically to the semiconductor substrate.

This makes it possible to apply the back gate bias (or well bias potential) from arbitrary places. The empty regions of the layout pattern can be used as the arbitrary places, which prevents the die size from increasing.

As described above, according to an aspect of this invention, there is provided a semiconductor integrated circuit device which enables four-terminal transistors to be formed with almost the same die size as when three-terminal transistors are formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a semiconductor substrate of a first conductivity type;
   a first well region of the first conductivity type which is formed in a first region of the semiconductor substrate;
   a plurality of second well regions of a second conductivity type which are formed in the first region of the semiconductor substrate excluding the region where the first well region has been formed;
   a third well region of the second conductivity type which is formed under the first and second well regions in the first region of the semiconductor substrate in such a manner that a part of the third well region under the first well region is removed and which connects the second well regions to one another electrically, the third well region is provided under the first well region and has a window which connects the first well region to the semiconductor substrate electrically;

a fourth well region of the first conductivity type which is formed in a second region of the semiconductor substrate;

a fifth well region of the second conductivity type which is formed in the second region of the semiconductor substrate so as to enclose the fourth well region;

a sixth well region which is formed under the fourth and fifth well regions in the semiconductor substrate so as to separate the fourth well region from the semiconductor substrate electrically;

a first group of MOS transistors which is formed in each of the first and second well regions and operates on a first power supply voltage;

a second group of MOS transistors which is formed in each of the fourth and fifth well regions and operates on a second power supply voltage;

at least one first terminal which applies a first bias potential to the first well region;

at least one second terminal which applies a second bias potential to the second and third well regions; and at least one third terminal which applies a third bias potential to the fourth well region.

2. The semiconductor integrated circuit device according to claim 1, further comprising a MOS transistor provided in the first well region, wherein the MOS transistor is provided so as to avoid the edge of the third well region corresponding to the window.

3. The semiconductor integrated circuit device according to claim 1, further comprising at least one fourth terminal configured to apply a second bias potential to the fifth and sixth well regions.

4. A semiconductor integrated circuit device comprising:
a semiconductor substrate of a first conductivity type;
a first well region of the first conductivity type which is formed in a first region of the semiconductor substrate;
a plurality of second well regions of a second conductivity type which are formed in the first region of the semiconductor substrate excluding the region where the first well region has been formed;
a third well region of the second conductivity type which is formed under the first and second well regions in the first region of the semiconductor substrate in such a manner that a part of the third well region under the first well region is removed and which connects the second well regions to one another electrically, the third well region is shaped like stripes which are arranged in parallel with one another and connected to one another electrically;
a fourth well region of the first conductivity type which is formed in a second region of the semiconductor substrate;
a fifth well region of the second conductivity type which is formed in the second region of the semiconductor substrate so as to enclose the fourth well region;
a sixth well region which is formed under the fourth and fifth well regions in the semiconductor substrate so as to separate the fourth well region from the semiconductor substrate electrically;
a first group of MOS transistors which is formed in each of the first and second well regions and operates on a first power supply voltage;

a second group of MOS transistors which is formed in each of the fourth and fifth well regions and operates on a second power supply voltage;

at least one first terminal which applies a first bias potential to the first well region;

at least one second terminal which applies a second bias potential to the second and third well regions; and at least one third terminal which applies a third bias potential to the fourth well region.

5. The semiconductor integrated circuit device according to claim 4, wherein the first well region is shaped like strips which are arranged in parallel with one another in a direction crossing the third well region.

6. The semiconductor integrated circuit device according to claim 5, further comprising a MOS transistor provided in the first well region, wherein the MOS transistor is provided so as to avoid the edge of the third well region shaped like strips.

7. A system comprising:
a host processor;
an I/O processor which connects the host processor to peripheral units or a network;
a main memory which holds a necessary program for the host processor to operate; and
a graphic processor connected to the host processor by a processor bus,
wherein at least one of the host processor, the I/O processor and the graphic processor including;
a semiconductor substrate of a first conductivity type;
a first well region of the first conductivity type which is formed in the semiconductor substrate;
a plurality of second well regions of a second conductivity type which are formed in the semiconductor substrate excluding the region where the first well region has been formed;
a third well region of the second conductivity type which is formed under the first and second well regions in the semiconductor substrate in such a manner that a part of the third well region under the first well region is removed and which connects the second well regions to one another electrically,
at least one first terminal which applies a first bias potential to the first well region; and
at least one second terminal which applies a second bias potential to the second and third well regions;
a fourth well region of the first conductivity type formed in a second region of the semiconductor substrate;
a fifth well region of the second conductivity type formed in the second region of the semiconductor substrate so as to enclose the fourth well region;
a sixth well region formed under the fourth and fifth well regions in the semiconductor substrate so as to separate the fourth well region from the semiconductor substrate electrically;
a first group of MOS transistors formed in each of the first and second well regions, and configured to operate on a first power supply voltage;
a second group of MOS transistors formed in each of the fourth and fifth well regions, and configured to operate on a second power supply voltage; and
at least one third terminal configured to apply a third bias potential to the fourth well region.

8. The system according to claim 7, wherein the host processor includes a main processor, I/O sections, and a plurality of digital signal processors.

9. The system according to claim 7, wherein the graphic processor includes a controller, I/O sections, and an arithmetic processing section.

10. The system according to claim 9, wherein the controller controls the communication with the host processor and the arithmetic processing section.

11. The system according to claim 10, wherein the arithmetic processing section includes a rasterizer and a plurality of signal processors.

* * * * *